United States Patent
Toledo et al.

(10) Patent No.: US 8,674,530 B2
(45) Date of Patent: Mar. 18, 2014

(54) PASSIVELY COOLED LIGHTWEIGHT THERMOELECTRIC GENERATOR SYSTEM

(75) Inventors: David Toledo, Salt Lake City, UT (US); Paul Slusser, Holladay, UT (US)

(73) Assignee: Power Practical, Inc., Salt Lake City, UT (US)

( * ) Notice: Subject to any disclaimer, the term of this patent is extended or adjusted under 35 U.S.C. 154(b) by 200 days.

(21) Appl. No.: 13/332,237

(22) Filed: Dec. 20, 2011

(65) Prior Publication Data

US 2012/0153636 A1    Jun. 21, 2012

Related U.S. Application Data

(60) Provisional application No. 61/425,699, filed on Dec. 21, 2010.

(51) Int. Cl.
F02B 63/04    (2006.01)

(52) U.S. Cl.
USPC .......................................... 290/1 R; 136/205

(58) Field of Classification Search
None
See application file for complete search history.

(56) References Cited

U.S. PATENT DOCUMENTS

| | | | |
|---|---|---|---|
| 2,987,564 A | | 6/1961 | Imelmann |
| 3,081,364 A | | 3/1963 | Henderson et al. |
| 3,082,276 A | * | 3/1963 | Corry et al. .................. 136/205 |
| 3,123,726 A | | 3/1964 | Maynard |
| 3,321,840 A | | 5/1967 | Pedersen |
| 5,544,488 A | | 8/1996 | Reid |
| 6,588,419 B1 | | 7/2003 | Buezis et al. |
| 6,787,691 B2 | | 9/2004 | Fleurial et al. |
| 2009/0205694 A1 | | 8/2009 | Huettner et al. |
| 2011/0284047 A1 | * | 11/2011 | Johnson et al. ............... 136/205 |
| 2012/0181971 A1 | * | 7/2012 | Birkeland et al. ............ 320/101 |

OTHER PUBLICATIONS

TEG Power, "TEG Power Brick (AKA "Ice TEG")" retrieved from Internet http://www.tegpower.com/pro2.htm on Apr. 20, 2012, 3 pages.
Stealth Power Systems, "Multi-Purpose Power System," retrieved from Internet http://www.stealthpowersystems.com on Apr. 20, 2012, 1 page.
Termo-Gen AB, "Thermoelectric Mobile Charger," retrieved from Internet http://www.tragia.se, applicant admits prior art.
Hatsuden-Nabe Thermoelectric Cookpot Keeps Your iPhone Battery Charged, dated Jun. 14, 2011, retrieved from the Internet http://www.tuaw.com/2011/06/14/hatsuden-nabe-thermoelectric-cookpot-keeps-your-iphone-battery-c/ on Apr. 20, 2012, 3 pages.

(Continued)

Primary Examiner — Tulsidas C Patel
Assistant Examiner — Sean Gugger
(74) Attorney, Agent, or Firm — Lathrop & Gage LLP

(57) ABSTRACT

A portable device for generating electrical power comprises a vessel and a thermoelectric generator module. A gasket having an opening is included, along with a bottom plate that comprises a material having a higher thermal conductivity than a material comprising the gasket. A thermal interface enhancer is adjacent one of the top side of the module and the bottom side of the module. A thermal interface inhibitor is also included. The bottom plate is secured to the bottom portion of the vessel with a fastener such that an area is formed between them. The gasket is secured to the bottom plate within the area, and the spacer is configured around the fastener. The thermal interface inhibitor is configured to aid in the maintenance of a temperature differential between the vessel and the bottom plate when the bottom plate is heated.

20 Claims, 3 Drawing Sheets

(56) References Cited

OTHER PUBLICATIONS

Biolite, "Introducing the All New Biolite CampStove," retrieved from the Internet http://biolitestove.com/BioLite.html, on Apr. 20, 2012, 1 page.

Tellurex World Pot, "Remote Village—Dead Cell Phone—Need Help Now, If Your Can Start a Fire, Now You Can Place a Call," Jul. 8, 2011, retrieved from the Internet http://www.tellurex.com/about/world_pot.php on Apr. 20, 2012, 8 pages.

Emad Hanna, "Camping Pot Let's You Cook Up Some Electricity", Jun. 22, 2011, Discovery News, http://news.discovery.com/tech/camping-pot-lots-you-cook-up-some-electricity-110622.html.

* cited by examiner

PASSIVELY COOLED LIGHTWEIGHT THERMOELECTRIC GENERATOR SYSTEM

CROSS-REFERENCE TO RELATED APPLICATIONS

This application claims priority to U.S. Provisional Patent Application Ser. No. 61/425,699 filed Dec. 21, 2010, the disclosure of which is incorporated herein by reference.

BACKGROUND OF THE INVENTION

Portable electronic devices such as phones, radios, MP3 players, GPS units, et cetera, have become ubiquitous in societies across the globe. However, billions of people use biomass such as wood and other plant matter as a primary energy source, and lack access to any form of electrical power with which they can power and charge electrical devices. Indeed, a reliable power source is presently available only to roughly half of the total global population that resides within an established electrical grid, and even industrialized nations with a well-developed electrical grid may lose access to electricity during power outages. Moreover, many people lack access to electrical power when enjoying outdoor activities, or when traveling through remote areas. These and other such problems may be addressed by a reliable and portable electrical power generator.

There are many different power generation options commonly available in the market today, each with its respective advantages and disadvantages. For example, personal solar panels offer a portable means of electrical power generation when sunlight is present. However, solar chargers are often fragile and costly, and may be unable to generate power in scenarios where sufficient sunlight is not available, such as when indoors, at night, and in inclement weather. Batteries, such as high energy-density and lightweight lithium ion batteries, may also be used as a portable source of power. However, batteries add significant weight to any venture, generally have a fairly limited shelf-life, and their performance may suffer in cold and hot weather.

Thermoelectric generators present a promising alternative to such power-generation needs because of their ability to generate power under any scenario where a heating and cooling source is available. Thermoelectric generators harness the offset from equilibrium created by a temperature differential across dissimilar conductors, and convert this temperature difference directly into usable electrical power. However, portable and reliable thermoelectric power generators are noticeably absent from the marketplace. The present invention relates to a reliable and portable thermoelectric power generator system.

SUMMARY

According to one embodiment, a portable device for generating electrical power comprises a vessel configured to retain a phase change material. The vessel has a bottom portion and a side wall. The device includes a thermoelectric generator module which has a top side and a bottom side, and a gasket having an opening. A bottom plate is provided, and a material of the bottom plate has a higher thermal conductivity than a material of the gasket. The device includes a DC to DC voltage regulator, and a temperature resistant wire having first and second ends. The wire is at least partially enclosed within a temperature resistant conduit, and its first end is coupled to the module. A first thermal interface enhancer is adjacent the top side of the module, and a second thermal interface enhancer is adjacent the bottom side of the module. The device further includes a hollow spacer, and a thermal interface inhibitor that comprises a material having a lower thermal conductivity than the material of the bottom plate. The bottom plate is secured to the bottom portion of the vessel with a fastener such that an area is formed between them. The gasket is secured to the bottom plate within the area. The spacer is configured around the fastener, and the thermoelectric generator module is enclosed within the opening of the gasket. The module is positioned such that the module top side is relatively near to the bottom portion of the vessel and the module bottom side is relatively distant to the bottom portion of the vessel. The thermal interface inhibitor is secured adjacent the bottom portion above the spacer, and is configured to aid in the maintenance of a temperature differential between the vessel and the bottom plate when the bottom plate is heated. The first thermal interface enhancer is configured to improve thermal linkage between the bottom portion of the vessel and the top side of the module, and the second thermal interface enhancer is configured to improve thermal linkage between the bottom plate and the bottom side of the module.

According to another embodiment, a system for generating electrical power comprises a vessel configured to retain a phase change material. The vessel has a bottom portion and a sidewall. A thermoelectric generator module of the system has a top side and a bottom side. The system includes a bottom plate spaced apart from the vessel, forming an area. An interchangeable DC to DC voltage regulator is included, and a temperature resistant wire that is coupled to the thermoelectric generator module. A first thermal interface enhancer is adjacent the top side of the module, and a second thermal interface enhancer is adjacent the bottom side of the module. At least one of the first and second thermal interface enhancers comprise polyalphaolefin grease. A thermal interface inhibitor comprises a material having a lower thermal conductivity than a material comprising the bottom plate. The first thermal interface enhancer is configured to decrease a thermal impedance between the bottom portion of the vessel and the top side of the module, and the second thermal interface enhancer is configured to decrease a thermal impedance between the bottom plate and the bottom side of the module. The thermal interface inhibitor is configured to aid in the maintenance of a localized temperature differential between the vessel and the bottom plate when the bottom plate is heated.

According to yet another embodiment, a portable device for generating electrical power comprises a vessel comprising aluminum. The vessel is configured to retain a phase change material, and has a bottom portion and a side wall. A gasket having an opening is included, along with a bottom plate that comprises a material having a higher thermal conductivity than a material of the gasket. A temperature resistant wire has a first end and a second end. The first end is coupled to the thermoelectric generator module. A thermal interface enhancer is adjacent one of the top side of the module and the bottom side of the module. A thermal interface inhibitor is included, and comprises a material having a lower thermal conductivity than the material comprising the bottom plate. A hollow spacer has a height equal to or greater than the height of the module. The bottom plate is secured to the bottom portion of the vessel with a fastener such that an area is formed between them. The gasket is secured to the bottom plate within the area with a fastener, and the spacer is configured around the fastener. The thermoelectric generator module is enclosed within the opening of the gasket. The module is positioned such that the module top side is relatively near to the bottom portion of the vessel and the module bottom side is relatively distant to the bottom portion of the vessel. The thermal interface inhibitor is configured to aid in the maintenance of a temperature differential between the vessel and the bottom plate when the bottom plate is heated.

BRIEF DESCRIPTION OF THE SEVERAL VIEWS OF THE DRAWINGS

Illustrative embodiments of the present invention are described in detail below with reference to the attached drawing figures, wherein.

DETAILED DESCRIPTION

Figure 1:
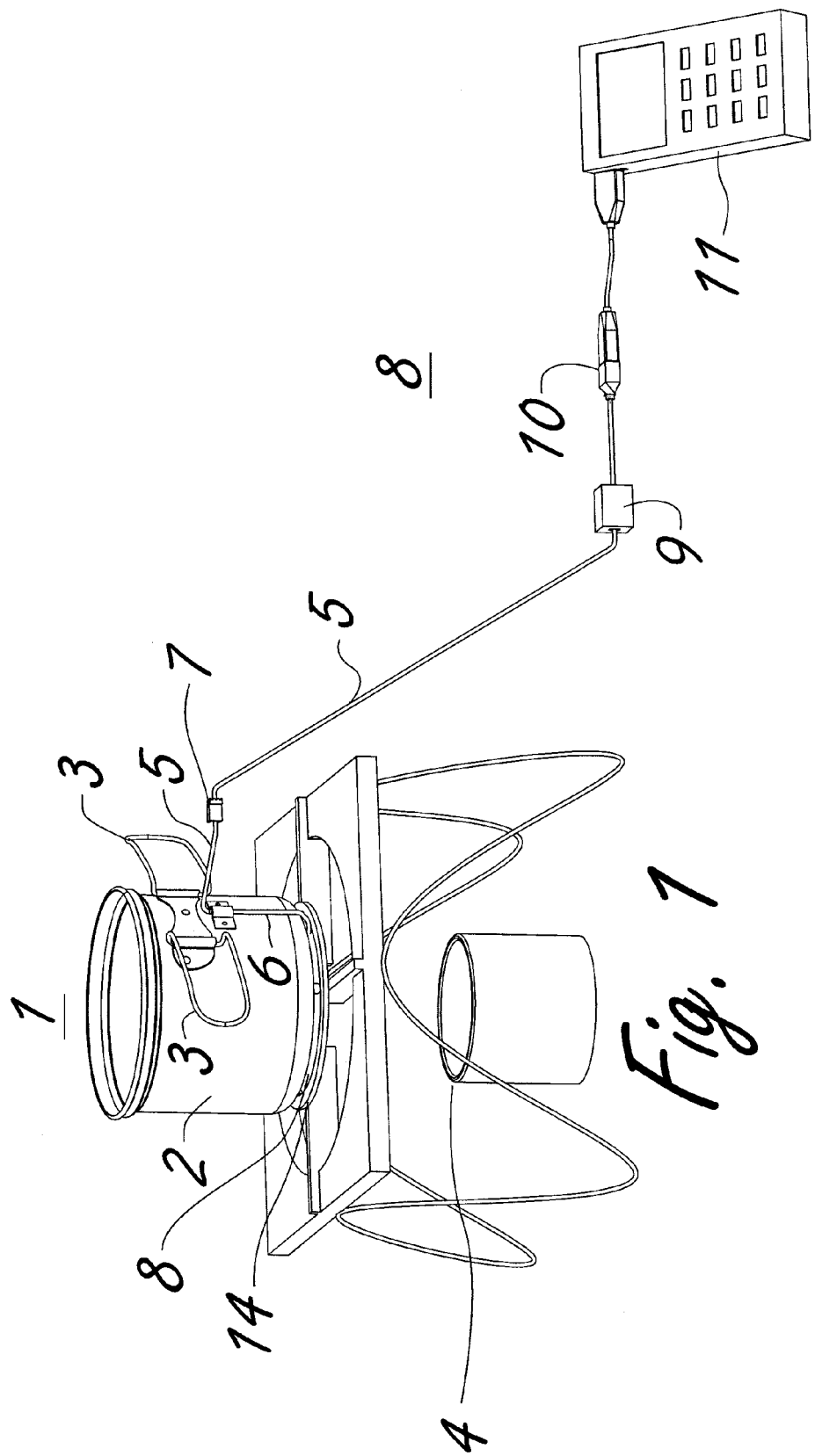
FIG. 1 is a perspective view of one embodiment of a portable thermoelectric power generation system in accordance with the teachings of the current invention.

The present invention utilizes the thermoelectric effect to generate electricity. More specifically, the temperature difference imposed across a thermoelectric element creates a voltage due to the differences in diffusivity and phonon drag imposed upon the n-type and p-type carriers within the thermoelectric element. Under the second law of thermodynamics, from statistical mechanics interpretation, the thermoelectric power of a material can also be defined as the entropy per charge carrier. The present invention harnesses the entropy created by the temperature differential imposed by the system, and transforms this entropy (heat) into electrical power.

Thomas J. Seebeck discovered thermoelectric power in 1821, and the conversion of temperature differences directly into electricity is appropriately known as the Seebeck effect. To realize a true thermoelectric device, both n-type and p-type materials are electrically coupled to complete a circuit. Jean-Charles Peltier discovered the presence of heat at an electrified junction of two dissimilar metals in 1834. The combination of the Seebeck and Peltier effects is known as the Thompson effect (after William Thomson-Lord Kelvin), who observed both phenomenons occurring simultaneously in 1851. By using these fundamental principles, thermoelectric devices can be created that, upon the application of power, cool from one side and emanate heat from the other; or, which generate power when one side of the device is cooled and the other side is simultaneously heated.

The efficiency by which a thermoelectric element converts heat into electricity is quantified by the dimensionless figure of merit (ZT), defined as $ZT=S^2*T*\sigma*1/k$. Here, T is the average temperature between the hot and cold sides, S is the Seebeck coefficient, $\sigma$ is the electrical conductivity, and k is the thermal conductivity. The figure of merit for a given material varies as a function of temperature, performing best at temperatures where ZT is maximized.

Bismuth telluride ($Bi_2Te_3$) is one of the most common and least expensive thermoelectric materials in use today. Thermoelectric modules containing $Bi_2Te_3$ may be purchased from a variety of manufacturers across the globe. Bismuth telluride may be made p-type or n-type by introducing impurities of antimony or selenium, respectively. The present invention may utilize thermoelectric material comprising bismuth telluride, as the temperature of the hot (about 300° C.) and cold (about 100° C.) sides of the present invention coincides well with the temperature range in which ZT for bismuth telluride is maximized.

Bismuth telluride thermoelectric generation modules (TEGM) may comprise n-type and p-type doped legs which are electrically joined in pairs. These pairs are then connected in electrical series to raise the voltage. The number of pairs of legs connected in the series determines the relative output voltage of the module at a given temperature differential. Bismuth telluride thermoelectric legs are most commonly coupled using copper interconnects. These coupled pairs in series are encapsulated between two parallel insulating plates. Such plates are commonly made of alumina. TEGM are commercially available today from a variety of sources. The number of TEGM electrically connected within the system influences the electrical power output, and the size, shape, materials, and number of junctions within a given TEGM may be varied from application to application.

FIG. 1 shows one embodiment of a lightweight thermoelectric power generator system 1 in accordance with the teachings of the current invention. The system 1 includes a vessel 2 that may be placed upon a heat source 4. The heat source 4 may be a flame from a petroleum, alcohol, or another combustible biomass fuel source, or the vessel 2 may be heated by other means. The power generated by the thermoelectric generator system 1 may be routed through an internal high-temperature-resistant wire 5a into a temperature resistant wire conduit 6, and then to a temperature resistant connector 7 using a high-temperature-resistant wire 5.

The vessel 2 may be lightweight, have a handle 3, and may be designed to retain and heat a phase change material such as water. The handle 3, in addition to being used in the typical manner to hold and relocate the vessel 2, may also be used to hold the high-temperature-resistant connecting wire 5 at an increased distance from the heat source 4. This is achieved by routing the high-temperature-resistant wire 5 and the connector 7 through the handle 3 during normal operation of the system 1.

A power regulation assembly 8 is electrically coupled to the generation system 1 through the connector 7. The temperature-resistant wire 5 leads away from the heat source 4 into an environmentally hardened circuit enclosure 9, and connects to a DC to DC voltage regulation circuit 9a. The DC to DC voltage regulation circuit 9a provides regulated voltage through a standard connector 10 to a mobile device 11, such as a cellular phone.

Figure 2:
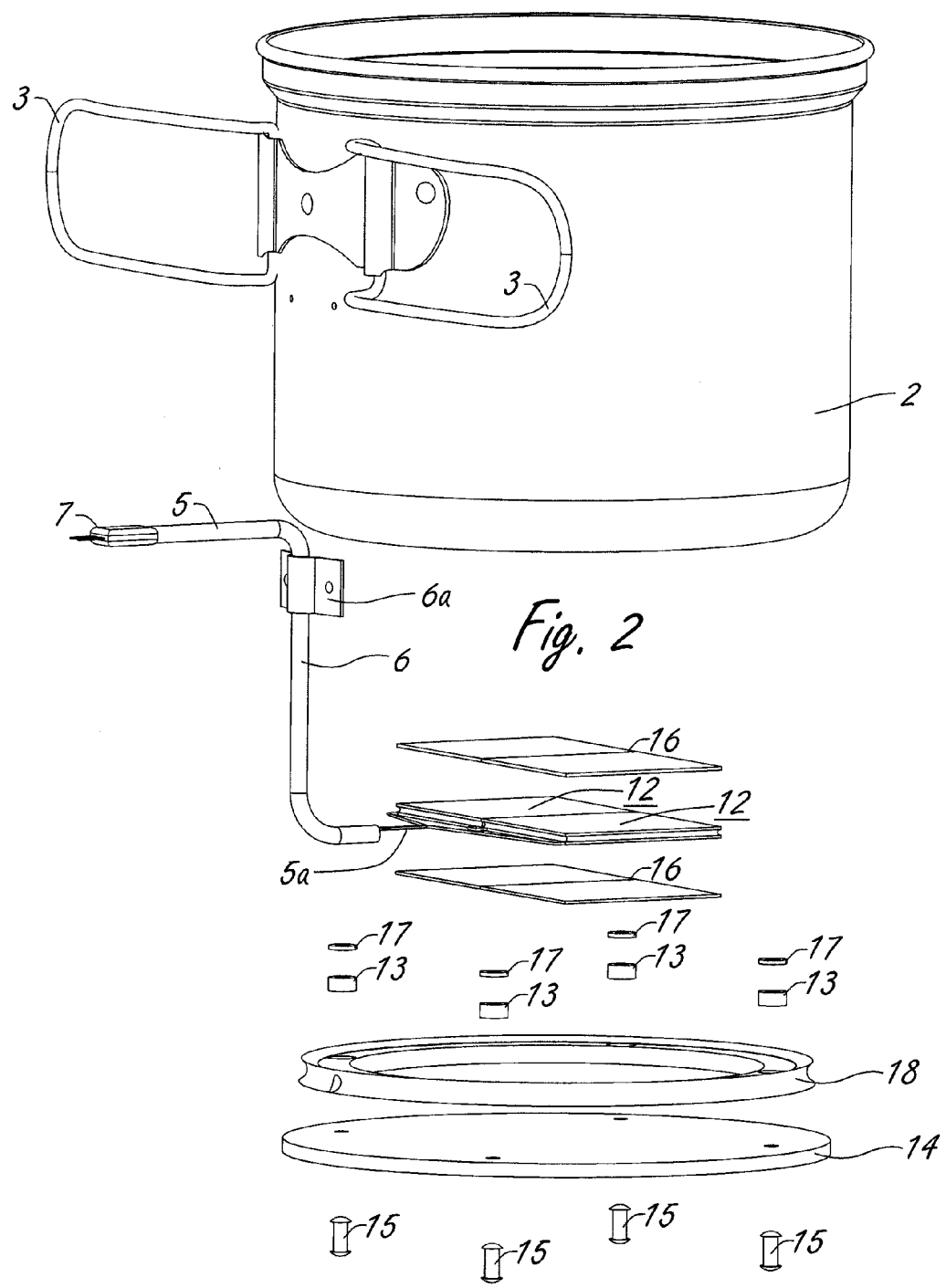
FIG. 2 is an exploded view of the portable thermoelectric power generation system of FIG. 1.

FIG. 2 illustrates an exploded view of the lightweight thermoelectric generator system 1 comprising the vessel 2 to which the TEGM 12 are affixed. A plurality of spacers 13 of a height (~0.010") slightly greater than the height of the TEGM 12 span the gap between the vessel 2 and bottom plate 14 (see FIG. 3). A bottom plate 14 is secured to the vessel 2 using fasteners 15, such as rivets or screws, which pass through the spacers 13. The spacers 13 maintain a gap between the vessel 2 and the bottom plate 14. The TEGM 12 are situated within this gap.

Figure 3:
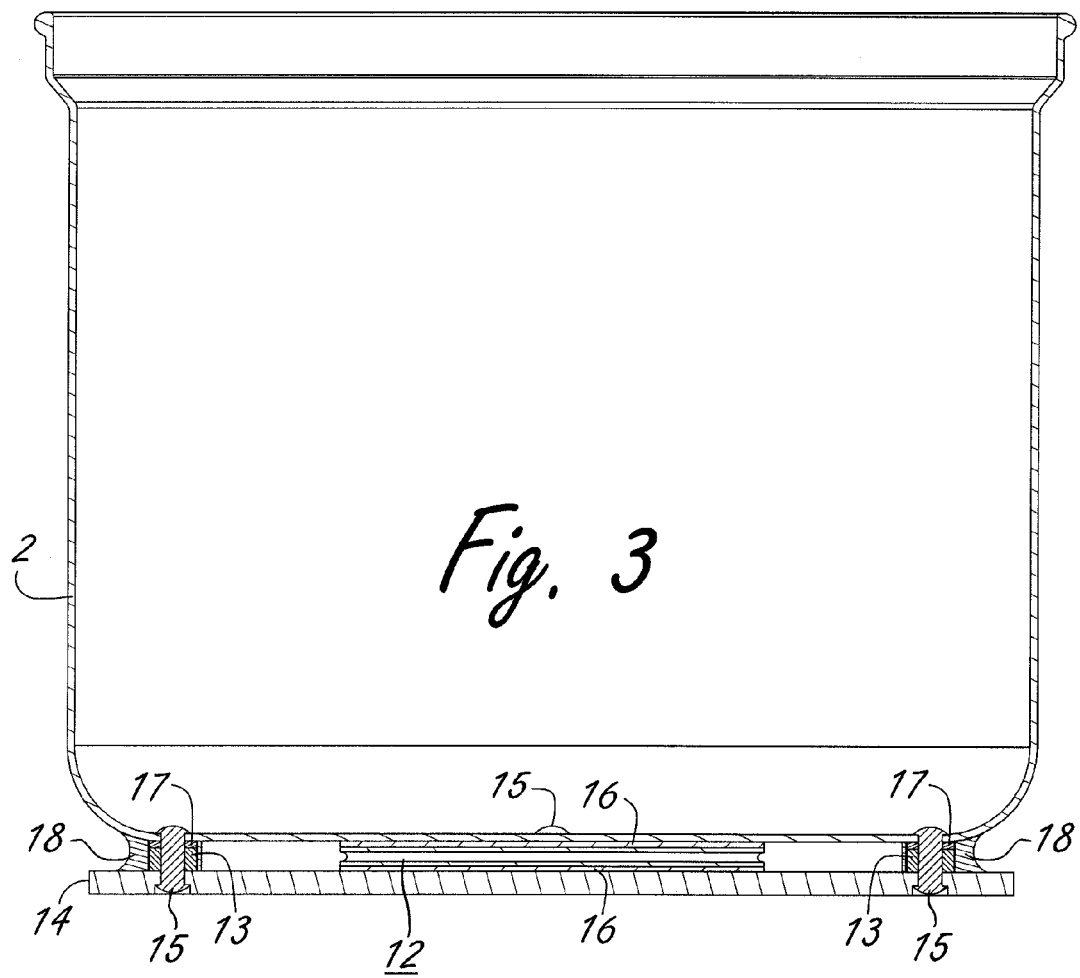
FIG. 3 is a side view showing the interrelationship between some of the components of the portable thermoelectric power generation system of FIG. 1.

In order to prevent damage to the TEGM 12 from water, combustion byproducts, and other debris, this gap is sealed around the circumference of the bottom of the vessel 2 with a high-temperature gasket 18 (see FIGS. 2, 3). A thermal interface enhancer 16 is tape cast on both sides of the TEGM 12 in order to maintain intimate thermal contact between the TEGM 12, the vessel 2, and the bottom plate 14. Thermal interface inhibitors 17 are placed between the vessel 2 and the plurality of spacers 13, and help achieve a higher temperature differential across the TEGM 12, as discussed in more detail below.

Using the high temperature conduit 6, the wire 5 is guided out of the bottom of the system 1 towards the rim of the vessel 2 along the handle 3. All or part of the conduit 6 may be secured to, and be in intimate thermal contact with the vessel 2, so as to limit the temperature within the conduit 6. The high-temperature wire 5 may comprise two multi-strand copper conductor wires of gauge adequate for handling the power output of the system 1. The wire 5 conducts the electrical power from the TEGM 12 to the regulation assembly 8, and ultimately provides power to the mobile device 11 using the standard connector 10. A plurality of devices 11 may be powered by the system 1, with the voltage being set by the regulation circuit 9a. Examples of such devices 11 include single cell lithium ion batteries in mobile devices that are typically charged using a 5V supply, and appliances commonly used in cars and RVs requiring a 12V supply, such as lights and fans, or two cell lithium ion devices. A currently preferred embodiment utilizes standard connectors 10 such as USB or US AUTO/MARINE sockets for outputs of 5V and 12V respectively, though the output voltage can be adjusted through the regulation circuit 9a to provide power to (or charge) a wide variety of low power devices that use non-standard voltages.

In a currently preferred embodiment of the system 1, the vessel 2 is stamped from a thin (0.0390") sheet of aluminum. Aluminum may be an exemplary material for the vessel 2 due to its high thermal conductivity (~250 W/mK), low density (2.7 g/cc), ease of formation, corrosion resistance, and low cost. The superior thermal conductivity allows for rapid dissipation of the heat from the TEGM 12, correspondingly creating an ultimately lower cold side temperature during operation of the system 1. Stainless steel, which is the most common material used to form vessels for boiling water, may also be employed to form the vessel 2. However, it is noted that the thermal conductivity of aluminum is more than ten times greater the thermal conductivity of stainless steel (~19 W/mK), and that the density of aluminum is about three times less than the density of stainless steel (7.9 g/cc). The use of aluminum to form the vessel 2, hence, may provide the system 1 with increased efficiency, portability, and profitability. Additionally, the surface of the aluminum vessel 2 may be hard anodized to a preferred thickness of 200 μm for electrical insulation, surface hardening, and corrosion resistance, which increases the robustness of the system 1 and reduces the possibility of a short circuit (through the vessel 2) if the electrical insulation of the internal high-temperature wire 5a sustains damage.

Each spacer 13 is a hollowed sleeve made of a high temperature material, such as a metal or ceramic, and is placed around the mechanical fastener 15 (e.g., rivets or screws). The spacers 13 bear most of the compressive loads involved in keeping the bottom plate 14 and the vessel 2 intact. This is advantageous as compared to placing such loads on the TEGM 12 itself, as damage to the TEGM 12 is prevented in case the system 1 experiences a shock, such as when an object accidentally falls into the vessel 2. Moreover, as the spacers 13 are closer to the edge of the bottom plate 14 as compared to the TEGM 12, mechanical stability of the system 1 upon impact on the edge of the bottom plate 14 (for e.g., when system 1 is dropped) is also improved, because of the decrease in the bending moment/lever arm distance. Additionally, the spacers 13 prevent deformation of the bottom of the vessel 2 during attachment of the bottom plate 14 with the fasteners 15. This may be particularly desirable as it keeps the bottom of the vessel 2 flat, allowing for intimate thermal contact with the flat surfaces of the TEGM 12. The material and wall thickness of the spacers 13 may be varied to allow for more or less thermal conductance through the spacers 13 as compared to the TEGM 12; this provides a means with which to prevent the TEGM 12 from overheating (for e.g., when the vessel 2 and the bottom plate 14 have a much larger cross-sectional area than the TEGM 12.)

To insure optimized thermal contact while maintaining mechanical stability of the system 1, the TEGM 12 are affixed to the vessel 2 as described herein. The bottom plate 14 may be made of a variety of high temperature resistant materials, though it may be desirable for the bottom plate 14 to be made of material having a high thermal conductivity. The thickness of (and type of material used to make) the bottom plate 14 may depend on several considerations. For example, minimizing the thickness of the bottom plate 14 may help to maintain low weight and high thermal conductance. Conversely, however, a thicker bottom plate 14 may help to preserve structural integrity of the system 1 in case it is dropped. Moreover, if the bottom plate 14 is not sufficiently thick, damage may result due to high temperature creep, or deformation may occur due to thermal cycling or thermal annealing. Keeping these and other relevant considerations in mind, the bottom plate 14 in a currently preferred embodiment is made of one eighth inch thick solution heat treated and artificially aged rolled T6 5052 aluminum Thermal transport can occur through a variety of different mechanisms depending on the scenario. In electrically insulating solids, thermal transport occurs primarily through phonon transfer. A phonon is an excited quantum vibrational state in which the lattice of a material oscillates at a given frequency. There is not a single vibrational frequency of phonons in a system, but rather a distribution which follows the dispersion relation. The speed of sound in a given material is the speed at which phonons (and therefore heat) is transferred through the lattice. In solids that are electrically conductive, heat is also carried by charge carriers in accordance with Wiedemann-Franz law. In gasses, thermal transport occurs through simple diffusion and convection.

In a vacuum, thermal energy is transferred through electromagnetic radiation, and is generally referred to as radiative heat transfer. Radiative heat transfer is not only limited to vacuums, but rather is omnipresent as electromagnetic energy emitted from any black body. It is well know that radiative heat transfer occurs in proportionality to the temperature raised to the fourth power; thus, radiative heat transfer is virtually inconsequential at low temperatures, and becomes increasingly dominant at higher temperatures. The thermal transport within the thermoelectric power generation system 1 described herein is generally limited to solids, with phonon transfer and radiative heat transfer being the two major transport mechanisms.

The overall thermal impedance (analogous to electrical impedance) of heat transfer from the bottom plate 14 to the vessel 2 through the TEGM 12 is decreased using the thermal enhancer 16 at the interfaces of the TEGM 12 with the vessel 2 and the bottom plate 14. Contrarily, the spacers 13, in conjunction with the thermal inhibitors 17, serve to increase the thermal impedance. Resultantly, there is a larger thermal conductance through the TEGM 12 as compared to spacers 13, which increases the power output and efficiency of the system 1.

Further, improved thermal conductance is achieved by ensuring that phonon transport, as opposed to radiative transfer, is the dominant heat transfer mechanism in system 1 at both the macroscopic and microscopic scales, which is particularly important in the relatively low temperature regime in which the system 1 operates. For instance, to increase power output, the temperature at the interface of the vessel 2 and the TEGM 12 needs to be minimized, and radiative transfer is particularly undesirable because it causes a drastic increase in the thermal impedance at this interface. The thermal enhancer 16 serves the purpose of decreasing void space on both macroscopic and microscopic scales, allowing for the heat transfer to occur primarily by means of phonon transfer. Microscopic voids are not to be understated, as they are present at virtually all interfaces due to the finite smoothness of virtually any material surface, such as those of the alumina on the TEGM 12 and the anodized vessel 2. The roughness of these surfaces may be minimized through careful processing, such as slow anodization and fine polishing; however, these steps may increase the cost and difficulty of the production significantly.

The thermal interface enhancer 16 developed as part of the assembly of the system 1 may be a highly malleable and thermally conductive material. The thermal enhancer 16 may be composed of a mixture of thermally conductive particles, such as metallic aluminum or aluminum oxide and high temperature grease. Metallic particles are desirable due to their superior thermal conductivity, low cost, and malleability. Malleable particles enhance thermal conductivity due to their ability to conform to surface features smaller than the particle size, and also improve packing inside the matrix, thereby increasing the number of contacting particles. Grease may be a desirable matrix, though other highly malleable materials such as silicones may also be used, due to their singular molecular structure. The use of a matrix material may significantly decrease the number of void spaces, and may noticeably improve the thermal characteristics of system 1, particularly at the interfaces of TEGM 12 and the vessel 2/bottom plate 14. The application of grease as the matrix material for the thermal enhancer 16 is advantageous due to single molecule microstructure of said grease. Single molecules can easily flow into void spaces that would be otherwise inaccessible to other suitable malleable matrix materials, such as silicones, because other materials generally comprise a more heavily bonded microstructure. These bonds (e.g. crosslinks) prevent the material from flowing into the microscopic void spaces, and therefore impede the performance of the system 1.

Minimizing void spaces increases the rate of heat transfer in the system 1 as a more continuous path for phonon transport is then available. The particle size and the type of grease may be varied for the particular application. In a currently preferred embodiment, 30 micron aluminum particles are added to non-melting, incombustible, low migration high temperature polyalphaolefin grease. The volume fraction of particles embedded in the grease matrix may affect both the thermal and mechanical properties of the thermal interface enhancer 16. In a currently preferred embodiment the volume fraction of particles is greater than 0.5. Polyalphaolefin greases are commercially available from TOMPAC Inc. The polyalphaolefin grease also acts as an oxygen barrier, shielding the metallic particles from oxidizing into a less thermally conductive oxide material.

This high viscosity slurry of enhancer 16, in addition to thermally linking the TEGM 12 to the vessel 2 and bottom plate 14, also reduces the risk of damage to the TEGM 12 when the system 1 experiences a shock (such as when it is accidentally dropped). Additionally, the particles distributed throughout the matrix physically impede the migration of grease, and prevent the movement of the TEGM 12 with respect to the vessel 2 and the bottom plate 14. This ensures optimized thermal contact and mechanical stability throughout the lifetime of the system 1, and allows the system 1 to better endure thermal cycling, general use, and transportation. The addition of high thermal conductivity particles to the grease may be well in excess of the percolation threshold (~16% for spherical particles) for optimized thermal conductivity and shear viscosity. This ensures maximized physical contact between adjacent particles, allowing for thermal conduction to occur through phonon transfer along a high-speed metallic pathway. Likewise, as previously noted, the interconnectedness of this pathway may prove to be a barrier to matrix migration.

The TEGM 12 are placed on the bottom of the vessel 2, and the wires 5a may be thermally linked and mechanically fastened to the vessel 2. As noted, coupling the wires 5a to the vessel 2 thermodynamically limits the maximum temperature rise available to the wire due to the presence of a phase change material in the vessel 2.

A thermal interface inhibitor 17 may be used during assembly in order to mitigate unwanted thermal transport during the operation of the system 1. The thermal interface inhibitor 17 is added to help increase the localized temperature differential between the vessel 2 and the bottom plate 14 at the spacers 13, which aids in the maintenance of a temperature differential across the TEGM 12, and thereby increases the output voltage of the system 1. The material selected for the thermal interface inhibitor 17 may have a thermal conductivity less than 1 W/mK. In a currently preferred embodiment the thermal interface inhibitor 17 material is a cross-linked silicone polymer fiber glass composite. Usage of this composite in the thermal interface inhibitor 17 also serves to absorb shocks and vibrations sustained by the system 1 that may otherwise be transmitted to the TEGM 12, and therefore increases the reliability and durability of the system 1.

Thermal conductance through the spacers 13 is minimized through controlling the phonon transport at the interface of the spacers 13 and the vessel 2. This is achieved through the use of amorphous and low stiffness materials, which are known to have decreased phonon transport relative to materials possessing a regular lattice structure. Examples of such materials are silicones that are both amorphous and have a low elastic modulus, and glasses which are amorphous by definition. Composites may also be made by combining these two material classes, so as to increase mechanical strength and to impede phonon transport at the spacers 13.

The thermal gasket 18 may be composed of a high temperature and flame resistant material, and serves to encapsulate and protect the TEGM 12 from environmental damage due to dirt, liquid, fuel, or combustion byproducts. The gasket 18 also creates thermal discontinuity between the vessel 2 and the bottom plate 14. In a currently preferred embodiment the gasket 18 is made of cross-linked polydimethylsiloxane silicone rubber composite that is highly resistant to temperature, corrosion, and abrasion. A composite material is created by the addition of a second phase such as fiberglass that improves the mechanical strength and further decreases th thermal conductivity of the gasket 18. Such a composite may be desirable for enclosing the gap between the vessel 2 and the bottom plate 14 as compared to metallic material, as the low thermal conductivity of the composite allows for a larger temperature gradient across the TEGM 12, and thereby increases the power output of the system 1. The gasket 18 may be made in a mold or formed in place between the vessel 2 and the bottom plate 14. The thermal gasket 18 may also serve to dampen vibrations and shocks endured by the system 1.

In a currently preferred embodiment, the high temperature resistant wire 5 is optimized for durability and environmental toughness. Multi-strand wires have higher conductivity than a single strand of equivalent gauge, and are more capable of withstanding higher mechanical deformation cycling sustained during regular operation of the system 1 (and its use with the voltage regulation assembly 8). The conducting wire 5 may be insulated with a high temperature dielectric material such as polytetrafluoroethylene, cross-linked polydimethylsiloxane, or a polyimide. In a currently preferred embodiment the high-temperature wire 5 is a polytetrafluoroethylene insulated wire, inside a braided stainless steel jacket, within a polytetrafluoroethylene sleeve. The braided jacket serves to distribute a thermal hot spot over a greater length of the wire 5, thus decreasing the risk of electrical failure due to overheating. The wire 5 is then put inside a self-extinguishing cross-linked polydimethylsiloxane-fiberglass composite sleeve. This outer sleeve adds additional thermal and abrasion protection to the enclosed wire 5, preventing overheating and mechanical wear.

The conduit 6 protecting the high temperature wire 5 may be made of aluminum, which is easily formed to fit the shape of the vessel 2. Aluminum is also favorable as its high thermal conductivity prevents localized heating of the enclosed wire 5, and the relatively high toughness of aluminum decreases the risk of damage to the wire 5 due to impact. Additionally the high-temperature wire conduit 6 is physically attached and thermally linked to the vessel 2 using a metal strap 6a, that serves to increases both the mechanical and thermal robustness of the wire 5 by limiting the maximum temperature rise of the conduit 6 and the enclosed wires 5.

The high-temperature connector 7 may be a 2 pin DC power connector with a molded high-temperature material, such as porcelain or glass-nylon composite housing. This connector 7 is designed for high-temperature environments where it is necessary to make DC electrical connections. An example of such a connector 7 appears in U.S. Pat. No. 6,267,626, which is incorporated herein by reference. Such connectors 7 are commercially available through a number of sources, for example, the OMEGA corporation.

When heat is applied to the heat receiving side of the system 1 (i.e., the bottom plate 14), the initial temperature differential across the TEGM 12 is small, and hence, the voltage produced by the TEGM 12 may be too small to be useful. Additionally, during normal operation, fluctuations in the temperature of the hot and cold sinks can produce significant fluctuation in the unregulated output voltage of the system 1, both above and below the required output voltage required to provide power to the mobile device 11. Additionally, when a large thermal difference is experienced by the TEGM 12, the output voltage of the generation system 1 may be above the voltage required by the mobile device 11, which, if unregulated, may damage the device 11. In a currently preferred embodiment, the challenge of providing a stable output voltage to the mobile device 11 is overcome through the use of a commercially available pulse width modulation (PWM) DC to DC voltage conversion circuit 9a contained in enclosure 9. Thus, voltages below those needed by the mobile device 11 are boosted, and voltages above those needed are reduced to the desired output voltage. Recent advances in the art of pulse width modulation DC/DC conversion electronics allow these circuits to operate with over 90% efficiency, and allow them to occupy relatively little physical space. This allows for the voltage regulation assembly 8 to be highly compact and lightweight. State-of-the-art voltage regulation pulse width modulation controllers are commercially available from a variety of providers, including, for example, Maxim and Texas Instruments.

Physical separation of the power regulation electronics 9a from the heat source 4 and the vessel 2 via the temperature resistant wire 5 serves to protect the power regulation electronics 9a from damage due to overheating. Additionally, the power regulation circuit enclosure 9 provides physical protection to the regulation circuit 9a. The circuit enclosure 9 may also be filled with epoxy to protect the voltage regulation circuit 9a from damage due to shock or moisture. High thermal conductivity epoxy is preferred as it prevents overheating by conducting heat generated by the regulation circuit 9a during operation. The standard electrical connector 10 may extend from the circuit enclosure 9 or may be contained within the circuit enclosure 9. The power regulation assembly 8 is electrically coupled to the generation system 1 through the high temperature connector 7. This allows for the regulation assembly 8 to be detached from the system 1, thereby increasing the ease of transportation and storage of the system 1. Additionally the power regulation circuit 9a may be modified for different output voltages with distinct regulation assemblies 8 tailored to the desired application. Detachability of the regulation assembly 8 allows for the same generation system 1 to be used interchangeably with different regulation assemblies 8, as may be required for different devices 11.

Many different arrangements of the various components depicted, as well as components not shown, are possible without departing from the spirit and scope of the present invention. Embodiments of the present invention have been described with the intent to be illustrative rather than restrictive. Alternative embodiments will become apparent to those skilled in the art that do not depart from its scope. A skilled artisan may develop alternative means of implementing the aforementioned improvements without departing from the scope of the present invention.

It will be understood that certain features and subcombinations are of utility and may be employed without reference to other features and subcombinations and are contemplated within the scope of the claims. Not all steps listed in the various figures need be carried out in the specific order described.

We claim:

1. A portable device for generating electrical power, the device comprising:
a vessel configured to retain a phase change material, the vessel having a bottom portion and a side wall;
a thermoelectric generator module, the module having a top side and a bottom side;
a gasket having an opening;
a bottom plate, the bottom plate comprising a material having a higher thermal conductivity than a material comprising the gasket;
a DC to DC voltage regulator;
a temperature resistant wire having a first end and a second end, the wire being at least partially enclosed within a temperature resistant conduit, the first end being coupled to the thermoelectric generator module;
a first and a second thermal interface enhancer, the first enhancer being adjacent the top side of the module, the second enhancer being adjacent the bottom side of the module;
a thermal interface inhibitor, the thermal interface inhibitor comprising a material having a lower thermal conductivity than the material of the bottom plate; and
a hollow spacer, a height of the spacer being not less than a height of the module;
wherein the bottom plate is secured to the bottom portion of the vessel with a fastener such that an area is formed therebetween, the gasket being secured to the bottom plate within the area, the spacer being configured around the fastener, the thermoelectric generator module being enclosed within the opening of the gasket, the module being positioned such that the module top side is relatively near to the bottom portion of the vessel and the module bottom side is relatively distant to the bottom portion of the vessel;

wherein the thermal interface inhibitor is secured adjacent the bottom portion above the spacer, the thermal interface inhibitor configured to aid in the maintenance of a temperature differential between the vessel and the bottom plate when the bottom plate is heated;

wherein the first thermal interface enhancer is configured to improve thermal linkage between the bottom portion of the vessel and the top side of the module, and the second thermal interface enhancer is configured to improve thermal linkage between the bottom plate and the bottom side of the module.

2. The device of claim 1, wherein:
the wire is secured to the sidewall of the vessel; and
the phase change material is water.

3. The device of claim 1, wherein the bottom plate comprises aluminum.

4. The device of claim 1, wherein at least one of the first and second thermal interface enhancers comprises aluminum oxide and grease.

5. The device of claim 1, wherein at least one of the first and second thermal interface enhancers comprises aluminum and polyalphaolefin grease.

6. The device of claim 5, wherein the spacer comprises at least one of silicone and glass.

7. The device of claim 6, wherein the gasket comprises a cross-linked polydimethylsiloxane silicone rubber and fiberglass composite.

8. The device of claim 1, wherein the thermal interface inhibitor has a thermal conductivity less than 1 W/mK.

9. The device of claim 1, wherein:
the wire is secured to the sidewall of the vessel by a holder;
the bottom plate comprises aluminum;
at least one of the first and second thermal interface enhancers comprises aluminum and polyalphaolefin grease; and
the thermal interface inhibitor comprises a cross-linked silicone polymer fiberglass composite.

10. The device of claim 9, wherein the DC to DC voltage regulator comprises a pulse width modulation DC to DC voltage conversion circuit.

11. The device of claim 10, wherein:
the DC to DC voltage regulator is enclosed within a case; and
the case is at least partially filled with epoxy.

12. A system for generating electrical power, the system comprising:
a vessel configured to retain a phase change material, the vessel having a bottom portion and a side wall;
a thermoelectric generator module, the module having a top side and a bottom side;
a bottom plate spaced apart from the vessel wherein an area is formed therebetween;
an interchangeable DC to DC voltage regulator;
a temperature resistant wire, the wire being coupled to the thermoelectric generator module;
a first and a second thermal interface enhancer, the first enhancer being adjacent the top side of the module, the second enhancer being adjacent the bottom side of the module, at least one of the first and second enhancers comprising polyalphaolefin grease; and
a thermal interface inhibitor, the thermal interface inhibitor comprising a material having a lower thermal conductivity than a material of the bottom plate;

wherein the first thermal interface enhancer is configured to decrease a thermal impedance between the bottom portion of the vessel and the top side of the module, and the second thermal interface enhancer is configured to decrease a thermal impedance between the bottom plate and the bottom side of the module;

wherein the thermal interface inhibitor is configured to aid in the maintenance of a localized temperature differential between the vessel and the bottom plate when the bottom plate is heated.

13. The system of claim 12, wherein:
a gasket having an opening is secured to the bottom plate within the area; and
the thermoelectric generator module is enclosed within the opening.

14. The system of claim 13 further comprising a hollow spacer, a height of the spacer being greater than a height of the module.

15. The system of claim 14, wherein the wire is secured to the sidewall of the vessel with a strap.

16. The system of claim 13, wherein:
the vessel comprises aluminum;
the gasket comprises a cross-linked polydimethylsiloxane silicone rubber and fiberglass composite; and
the thermal interface inhibitor has a thermal conductivity less than 1 W/mK.

17. A portable device for generating electrical power, the device comprising:
a vessel comprising aluminum, the vessel configured to retain a phase change material, the vessel having a bottom portion and a side wall;
a thermoelectric generator module, the module having a top side and a bottom side;
a gasket having an opening;
a bottom plate, the bottom plate comprising a material having a higher thermal conductivity than a material of the gasket;
a temperature resistant wire having a first end and a second end, the first end being coupled to the thermoelectric generator module;
a thermal interface enhancer, the enhancer being adjacent one of the top side of the module and the bottom side of the module; and
a hollow spacer, a height of the spacer being not less than a height of the module;
wherein the bottom plate is secured to the bottom portion of the vessel with a fastener such that an area is formed therebetween, the gasket being secured to the bottom plate within the area, the spacer being configured around the fastener, the thermoelectric generator module being enclosed within the opening of the gasket, the module being positioned such that the module top side is relatively near to the bottom portion of the vessel and the module bottom side is relatively distant to the bottom portion of the vessel.

18. The device of claim 17, further comprising:
a DC to DC voltage regulator; and
a thermal interface inhibitor;
wherein the thermal interface inhibitor is configured to aid in the maintenance of a temperature differential between the vessel and the bottom plate when the bottom plate is heated.

19. The device of claim 18, wherein the thermal interface inhibitor is located above the spacer.

20. The device of claim 19, further comprising an additional thermal interface enhancer.

* * * * *